(12) United States Patent
Kim et al.

(10) Patent No.: US 7,476,983 B2
(45) Date of Patent: Jan. 13, 2009

(54) SEMICONDUCTOR DEVICE INCLUDING WIRE BONDING PADS AND PAD LAYOUT METHOD

(75) Inventors: Na-Rae Kim, Seoul (KR); Tae-Sik Son, Yongin-si (KR); Hee-Joong Oh, Hwaseong-si (KR); Byung-Heon Kwak, Suwon-si (KR); Jae-Hoon Joo, Seongnam-si (KR); Hyung-Dong Kim, Suwon-si (KR); Young-Min Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/358,898

(22) Filed: Feb. 21, 2006

(65) Prior Publication Data

US 2006/0255477 A1   Nov. 16, 2006

(30) Foreign Application Priority Data

Feb. 21, 2005   (KR)   ........................ 10-2005-0013949
Feb. 28, 2005   (KR)   ........................ 10-2005-0016422

(51) Int. Cl.
*H01L 23/52* (2006.01)
*H01L 23/48* (2006.01)
*H01L 23/40* (2006.01)
*H01L 23/58* (2006.01)

(52) U.S. Cl. .................... 257/786; 257/784; 257/48; 257/773

(58) Field of Classification Search .............. 257/48, 257/786, 784, 773
See application file for complete search history.

(56) References Cited

U.S. PATENT DOCUMENTS

| 5,155,065 | A | | 10/1992 | Schweiss | 437/209 |
|---|---|---|---|---|---|
| 5,487,999 | A | * | 1/1996 | Farnworth | 216/18 |
| 5,686,762 | A | * | 11/1997 | Langley | 257/775 |
| 5,801,450 | A | | 9/1998 | Barrow | 257/784 |
| 6,037,669 | A | | 3/2000 | Shu et al. | 257/786 |
| 6,162,652 | A | * | 12/2000 | Dass et al. | 438/18 |
| 6,373,143 | B1 | * | 4/2002 | Bell | 257/786 |
| 6,617,622 | B2 | | 9/2003 | Kudou et al. | 257/207 |
| 6,937,047 | B2 | * | 8/2005 | Tran et al. | 324/763 |
| 6,940,093 | B2 | * | 9/2005 | Eldridge et al. | 257/48 |
| 7,015,580 | B2 | * | 3/2006 | Fitzsimmons et al. | 257/739 |

* cited by examiner

*Primary Examiner*—Luan Thai
(74) *Attorney, Agent, or Firm*—Mills & ONello, LLP

(57) ABSTRACT

In a layout structure of pads and a structure of pad used for a test or wire bonding of a semiconductor device, a size of at least one or more non-wire bonding pads is relatively small as compared with a size of at least one or more pads to be used for wire bonding of the semiconductor device. In the pad structure, a pad includes a wire bonding region that has an embossed surface for a portion of top metal layer within a determined pad size to improve the bonding process, and a probe tip contact region that does not have the embossed surface for a surface portion of the top metal layer within the determined pad size, so as to reduce wear of probe tip during testing of the device. Pad pitch can thereby be increased within a limited region, and peripheral circuits can be further formed in regions that would have been occupied in a conventional pad formation region. Higher integration of semiconductor devices and reduced wear of probe tip in probing is thereby realized.

18 Claims, 12 Drawing Sheets

US 7,476,983 B2

SEMICONDUCTOR DEVICE INCLUDING WIRE BONDING PADS AND PAD LAYOUT METHOD

RELATED APPLICATIONS

This application claims priority to Korean Patent Application No. 10-2005-0013949, filed on Feb. 21, 2005 and to Korean Patent Application No. 10-2005-0016422, filed on Feb. 28, 2005, in the Korean Intellectual Property Office, the disclosures of which are incorporated herein by reference, in their entirety.

BACKGROUND OF THE INVENTION

1. Technical Field of the Invention

The present invention relates to a semiconductor device, and more particularly, to a pad structure, pad layout structure and layout method in a semiconductor device.

2. Description of the Related Art

In semiconductor devices, particularly semiconductor memory devices, pads are provided to electrically connect a semiconductor memory device to external devices. Through the pads, signals including command signals, data read signals, and data write signals are input to or output by the device.

There is a continuing trend toward high integration in semiconductor memory devices and a corresponding reduction in design rule. Such high integration reduces the size of a semiconductor memory device, increasing the number of net dies produced from a semiconductor wafer and thereby reducing cost.

However, even though the degree of integration of devices increases, for example twofold, the number of pads generally does not increase at the same rate as the number of devices. Also, where the degree of integration is reduced by half, the number of pads is not reduced at the same rate as the number of devices. Thus, in a highly integrated device, the area occupied by the pads is generally not a significant issue, but in a relatively low-integrated device as compared with the high integrated device, the area occupied by the pads becomes an important issue. Accordingly, the semiconductor device manufacturing process has increasingly advanced with a continuous reduction in chip size, without a decrease in the size of pads. In other words, even though the overall size of the chip is reduced, the size of the pads cannot be readily decreased, since there is a strong investment required for updating bonding equipment and test equipment that are configured for a certain size pad.

FIG. 1 schematically illustrates a semiconductor memory device having pads according to a conventional configuration.

Referring to FIG. 1, a semiconductor memory device 10 includes a memory cell array MCA, and pad groups formed on a peripheral region of the memory cell array MCA. The memory cell array MCA includes unit memory cells formed on intersections of bit lines and word lines and disposed in a matrix type.

The pad group PG3 includes pads PD1, PD2, PD3, ..., PDn-2, PDn-1 and PDn. The pad group PG4 includes pads PD11, PD12, PD13, PD14, ..., PDm-2, PDm-1 and PDm. The pads PD1, PD2, PD3, ..., PDn-2, PDn-1, PDn, PD11, PD12, PD13, PD14, ..., PDm-2, PDm-1 and PDm provide an electrical connection between the semiconductor memory device 10 and external devices.

More in detail, the pads PD1, PD2, PD3, PDn-2, PDn-1, PDn, PD11, PD12, PD13, PD14, PDm-2, PDm-1 and PDm can be divided into: pads for testing the semiconductor memory device 10; pads for wire bonding the device with external devices; pads that are used for testing of the semiconductor memory device 10 but are not used for wire bonding, and pads that are used only for wire bonding. The test is executed using test equipment performing procedures that, following contact of a probe tip with the pad, cause signals related to a command input and data read and data write operations etc. to be input to the semiconductor memory device 10, or to be output by the device 10. The wire bonding pads are connected with a lead frame of a package, e.g., plastic package, through a metal line, e.g., gold wire, in a package bonding process.

In a peripheral region adjacent to the pad region, peripheral circuit devices for operation of the semiconductor memory device, e.g., buffers, a delay devices, MOS (Metal Oxide Semiconductor) transistors etc., are formed.

FIG. 2 is a schematic view illustrating an enlargement of pads shown in FIG. 1.

With reference to FIG. 2, pads PD11, PD12, PD13 and PD14, and a pad pitch PAD_PIT, are shown. Reference characters T1, T2, T3 and T4 indicate probe marks as portions recessed by a contact of probe tip.

The pads can be generally classified into pads that are used for testing of the semiconductor memory device and are used for wire bonding the device with external devices, and pads that are used only for testing and are not used for wire bonding of the semiconductor memory device. For example, the pad PD11 may be a wire bonding pad, the pad PD12 may be a non-wire bonding pad, the pad PD13 may be a wire bonding pad, and the pad PD14 may be a non-wire bonding pad. Or, the pad PD11 may be a wire bonding pad, the pad PD12 may be a wire bonding pad, the pad PD13 may be a wire bonding pad, and the pad PD14 may be a non-wire bonding pad. Both the pads to be bonded and not to be bonded are formed to have the same, uniform size. In other words, in the pads PD11, PD12, ..., wire bonding pads are not distinguished from non-wire bonding pads.

The pad pitch PAD_PIT indicates a distance between adjacent pads, and is related to a width margin for formation of a pad. For example, a pad pitch PAD_PIT between the pad PD11 and the pad PD12 is from the left end of the pad PD11 to the left end of the pad PD12. Generally, the sizes of the pads PD11, PD12, PD13, and the pad pitch, are substantially uniform throughout a device.

Wire bonding is generally performed by evading probe marks that are caused by a portion recessed by a probe tip. If the probe mark is contacted in the bonding process, adhesion between the pads and a bonding wire can become weak, causing a decrease in package yield.

In the pads shown in FIGS. 1 and 2, the bonding pads have also been used for testing procedures, where a probe has come in contact with the pad at locations T1, T2, T3, T4, thus the basic size of the bonding pads including probing regions 11, 13, 15 and 17 of FIG. 2, and wire bonding regions 12, 14, 16 and 18 of FIG. 2, should be guaranteed. For pads that are not bonded, only a smallest region for probing 11, 13, 15, 17 is ensured.

In such a conventional semiconductor memory device described above, the sizes of pads used for testing but not used for a wire bonding, and of pads used for both test and wire bonding, are substantially uniform, thus it is difficult to increase pad pitch within a determined region.

Further, since pads used for testing but not used for a wire bonding, and pads used for both testing and wire bonding, have a substantially uniform size, it is difficult to reduce the size of a pad region where the pads are formed, causing a limitation for a size reduction, and integration degree, of semiconductor memory devices. Such problems occur not only in semiconductor memory devices and but also in other types of semiconductor devices, e.g., microprocessor, CCD etc., in which pads are formed.

In the meantime, limitations exist not only in the layout of pads, but also in the structure of pads. For example, a mesh and non-mesh pad structure of conventional pads can lead to many problems. The problems will be described as follows, referring to FIGS. 3A to 4B.

FIGS. 3A and 3B are schematic views illustrating a structure of one of the pads shown in FIG. 1. FIG. 3A is a plan view and FIG. 3B is a sectional view taken along section line A1-A2 of FIG. 3A.

Referring to FIGS. 3A and 3B, a pad PD1 has a non-mesh structure, and has a structure in which an interlayer insulation layer 28 is formed on a semiconductor substrate 29, a first metal layer 26 is formed on the interlayer insulation layer 28, and a via layer 24 is formed on the first metal layer 26, piercing through an insulation layer between the first metal layer 26 and a second metal layer 22.

The second metal layer 22 is a portion of the pad that comes in contact with a probe tip, or is bonded to a wire, e.g., gold wire, in a packaging process.

In the pad PD1 of non-mesh structure, the via layer 24 connecting the first metal layer 26 to the second metal layer 22 is formed through the insulation layer. This type of structure is susceptible to open effects in a bonded portion in a wire bonding of the non-mesh structural pad PD1, for example, metal open, pad open, missing ball etc.

FIGS. 4A and 4B illustrate one type of pad to alleviate the shortcomings of the non-mesh structural pad shown in FIGS. 3A and 3B. FIG. 4A is a plan view of mesh structural pad, and FIG. 4B is a sectional view taken along section line B1-B2 shown in FIG. 4A.

With reference to FIGS. 4A and 4B, a pad PD30 of a mesh structure has a structure including an interlayer insulation layer 38 formed on a semiconductor substrate 39, and a first metal layer 36 is formed on the interlayer insulation layer 38. On the first metal layer 36, a plurality of contact plugs 34 are formed piercing an interlayer insulation layer 33, instead of forming a single via layer in the non-mesh structural pad example shown above in FIGS. 3A and 3B. The first metal layer 36 is then connected to a second metal layer 32 through the contact plugs 34.

The second metal layer 32 is a portion of the pad that comes in contact with a probe tip in a testing process or that is bonded to a wire in a packaging process, as in the non-mesh structural pad shown in FIGS. 3A and 3B. An upper surface of the second metal layer 32 is formed as an embossed surface referred to in FIG. 4A. Reference number 30 indicates a convex portion of the embossed surface.

As shown in FIGS. 4A and 4B, a mesh structure is applied to all portions of a determined pad region, and the structure of a pad is strengthened through use of the contact plugs 34, thereby reducing the likelihood of the occurrence of a metal open, a pad open and an open effect of missing ball, etc.

However, wear of the probe tip is common during test probing, due to the embossed surface of the mesh structure, and this causes an additional cost by necessitating the frequent change of probe cards.

Furthermore, particles are generated excessively in the contact of the probe tip with the pad, and a bonding force of the pad becomes weak in a wire bonding, which can result in the generation of defects in the operational characteristics of semiconductor memory devices and can lower package yield in the packaging process.

In addition, additional process time is required for probe tip cleaning in order to remove particles generated by probe tip contact, which can affect production costs of semiconductor memory devices.

SUMMARY OF THE INVENTION

Accordingly, one exemplary embodiment of the invention provides a pad layout structure in a semiconductor device, which is capable of obtaining a high integration by increasing a pad pitch in a limited region so as to form additional peripheral circuits in a region of the device formerly occupied by unused bonding pads. In the pad layout structure, the relative sizes of pads used for testing but not used for a wire bonding, and of pads for both testing and wire bonding are different, thereby reducing the area of the region occupied by the pads. In the pad layout structure, the area occupied by a region where pads are formed can be reduced by changing the respective structures of pads used for testing and for wire bonding.

Another exemplary embodiment of the invention provides a pad structure for a semiconductor device, which is capable of reducing wear of a probe tip during probing of a conventional mesh structural pad. The pad structure can reduce problems that otherwise can occur with the excessive generation of particles through contact between a probe tip and a pad, thus weakening the bonding force with the pad in a wire bonding process for a package. In the pad structure, the package yield in the packaging process is increased. Also, process time required for a probe tip cleaning to remove particles generated in the contact of the probe tip is reduced.

In one aspect, the present invention is directed to a layout structure of pads formed on a semiconductor device and used for at least one of testing and wire bonding of the semiconductor device, a first subset of the pads being non-wire-bonding pads that are used for testing of the device and not for wire bonding of the device, a second subset of the pads being wire-bonding pads that are used for wire bonding of the device, wherein the non-wire-bonding pads each has a first surface area that is less than a second surface area of each of the wire-bonding pads.

In one embodiment, both at least one of the wire-bonding pads and at least one of the non-wire-bonding pads are disposed in a same row or column of pads of the device.

In another embodiment, at least one of the non-wire-bonding pads is constructed and arranged to be in contact with, and electrically connected to, a probe tip of probe card during testing of the semiconductor device.

In another embodiment, at least one of the wire bonding pads includes a test region used during testing of the semiconductor device and a wire bonding region used during wire bonding of the semiconductor device.

In another embodiment, the test region is constructed and arranged to be in contact with, and electrically connected to, a probe tip of probe card during testing of the semiconductor device.

In another embodiment, the wire bonding region is a region where a wire for external electrical connection is to be bonded to the semiconductor device.

In another aspect, the present invention is directed to a structure of a pad of a semiconductor device used for wire bonding of the device, the pad having a top metal layer including a wire bonding region and a probe tip contacting region, wherein the wire bonding region has an embossed upper surface and the probe tip contact region has an upper surface that is not embossed.

In one embodiment the structure further comprises a plurality of contact plugs connecting the top metal layer to a bottom metal layer through an insulating layer in the wire bonding region of the pad.

In another embodiment, the contact plugs are not formed in the probe tip contact region of the device.

In another embodiment, the insulating layer is further formed between the top metal layer and the bottom metal layer in the probe tip contacting region of the pad.

In another embodiment, the structure further comprises a via layer in the insulating layer of the probe tip contacting region to electrically connect the bottom metal layer to the top metal layer in the probe tip contacting region.

In another embodiment, the wire bonding region is a region where a wire for external electrical connection is to be bonded to the semiconductor device in a first wire bonding process.

In another embodiment, the probe tip contact region is a region where a wire for external electrical connection is to be bonded to the semiconductor device in a second wire bonding process that is different than the first wire bonding process.

In another embodiment, the probe tip contact region is a region where the second wire bonding process is performed following probing by contact of a probe tip.

In another embodiment, the structure further comprises a via layer connecting a bottom metal layer to the top metal layer, and a plurality of contact plugs connecting the bottom metal layer to a substrate of the device through an insulating layer in the wire bonding region of the pad.

In another aspect, the present invention Is directed to a semiconductor device having wire bonding pads that are configured to obtain an external electrical connection, wherein a first pad and a second pad among the wire bonding pads have different structures, the first pad being a non-wire-bonding pad that is used for testing of the device and not for wire bonding of the device and being constructed and arranged for being in contact with a probe tip during testing of the device, the second pad being a wire-bonding pad that is used for wire bonding of the device and not for testing of the device and being constructed and arranged for wire bonding of the device during a wire bonding process.

In one embodiment, the second pad has an embossed surface to improve a bonding force in the wire bonding process.

In another embodiment, the first pad does not have the embossed surface.

In another aspect, the present invention is directed to a layout method of pads formed on a semiconductor device and used for at least one of testing and wire bonding of the semiconductor device, comprising: disposing a first subset of the pads to be non-wire-bonding pads that are used for testing of the device and not for wire bonding of the device; and disposing a second subset of the pads to be wire-bonding pads that are used for wire bonding of the device, wherein the non-wire-bonding pads each has a first surface area that is less than a second surface area of each of the wire-bonding pads.

In one embodiment, at least one of the wire bonding pads includes a test region used during testing of the semiconductor device and a wire bonding region used during wire bonding of the semiconductor device.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 5:
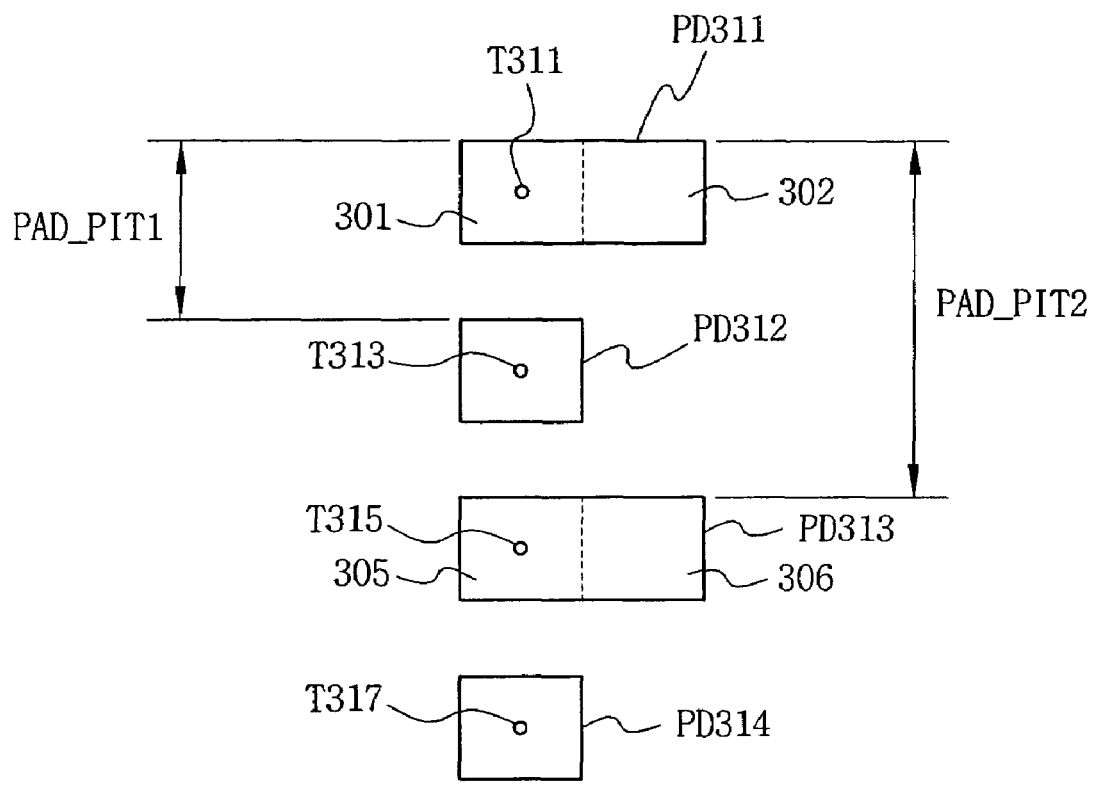
FIG. 5 is a schematic view illustrating a pad layout structure in a semiconductor device according to one exemplary embodiment of the invention.

FIG. 5 is a schematic view illustrating a pad layout structure in a semiconductor device according to one exemplary embodiment of the invention.

Referring to FIG. 5, pads PD311, PD312, PD313 and PD314, and a pad pitch PAD_PIT1, PAD_PIT2, are shown.

In semiconductor devices, particularly in a semiconductor memory device as an example, pads formed in a pad region of the semiconductor memory device enable the semiconductor memory device to be electrically connected with external devices. Signals concerning command input and data read and write operations are input to the device, or are output from the device, through the pads. The operations can be performed while the device is in a packaged state, or can be performed in a pre-packaged state by test equipment, e.g., a probing device, for testing of the device prior to the packaging process.

According to one exemplary embodiment of the invention, in a layout structure of pads that are formed in a semiconductor device to be used for a test of the semiconductor device or for wire bonding, the size of at least one non-wire bonding pads PD312 and PD314 is relatively small as compared with the size of at least one pads PD311 and PD313 that are used for wire bonding to the semiconductor device.

The pads PD311 and PD313 to be wire bonded to the semiconductor device are also used for testing of the semiconductor device. In other words, the wire bonding pads PD311 and PD313 each have a test region 301, 305 that is used for a probe landing used during a test, and a wire bonding region 302, 306 that is used for wire bonding.

The test region 301, 305 is a region at which the probe tip of a probe card comes in electrical contact with the device during a test of the semiconductor device. The probe tip of probe card is in contact with the test region 301, 305 and the device is tested for normal or abnormal operation. After the test, a probe mark T311, T315 is generated on the test region 301, 305.

The wire bonding region 302, 306 is a region of the bonding pad at which a wire for an electrical connection with a package pin or ball that is in turn connected to an external device is bonded in a packaging process.

Though in FIG. 3, the test regions 301, 305 and the wire bonding regions 302, 306 are shown as being distinguished by a dotted line, the regions may not so clearly defined in view of the number of the tests to be performed or in view of the contact position of the probe tip, etc. In the package process, the bonding is preferably performed in a manner so that the point of contact of the bonding wire with the pad avoids the probe mark T311, T315. If not, the bonding force between the pads and the bonding wire can become weak, which can be a primary factor in reducing package yield.

The non-wire bonding pads PD312 and PD314 are in contact with a probe tip of a probe card during a test, and are thereby electrically connected during testing. The probe tip of probe card makes contact with the pads PD312 and PD314, and normal or abnormal operation of the semiconductor device is tested. Following the test, a probe mark T313, T317 is generated on the pad PD312, PD314.

In the pads PD311, PD312, PD313 and PD314, the wire bonding pads PD311 and PD313 and the non-wire bonding pads PD312 and PD314 are sequentially mixed and both can be disposed in a row or a column of bonding pads of the device. That is, in the pad layout structure, each one of the pads PD311 and PD313 and the pads PD312 and PD314 can be disposed alternately as shown in FIG. 3. Also, the layout structure can be provided in a sequence of bonding pads, bonding pads, non-wire bonding pads and bonding pads. It may also be a sequence of non-wire bonding pads, bonding pads, non-wire bonding pads and bonding pads; or may be a sequence of bonding pads, non-wire bonding pads, non-wire bonding pads and bonding pads. Such layout sequences are merely examples of the arrangement of different types of pads that can be disposed in a pad region of the semiconductor device.

The pad pitch PAD_PIT1, PAD_PIT2 indicates an interval between pads, in other words, from an upper part of pad PD311 to an upper part of pad PD312, or from an upper part of pad PD311 to an upper part of pad PD313 as shown in FIG. 3.

A semiconductor device having the pads PD311, PD313, PD312 and PD314 includes a first pad for at least one or more pads PD311 and PD313, which are to be wire bonding pads, and a second pad for at least one or more pads PD312 and PD314, of which the size is smaller than the first pad and which are not used for wire bonding.

The first pad may include a test region of the pad that is used in the test, and a wire bonding region of the pad that is used for wire bonding. In describing as an example the pad PD311 of the first pad and the pad PD312 of the second pad, the pad PD311 can include a test region 301 and a wire bonding region 302. In the test region 301, a probe mark is generated as a portion that has been contacted by a probe tip of a probe card and so is recessed, following a test procedure.

The size of the pad PD 312 of the second pad can be substantially equal to a size of the test region 301 of the first pad PD 311.

The pad pitch PAD_PIT2, which is provided as an interval between the pad PD311 and the pad PD313 of the wire bonding pads and simultaneously provided as a side region of the pad PD313, is a region where a pad is not formed in a bonding pad layout structure according to one exemplary embodiment of the invention, though conventionally it was a region where a pad was formed. That is, in a conventional pad layout structure, the pad pitch PAD_PIT2 was substantially equal to the pad pitch PAD_PIT1 in its interval, but in a pad layout structure according to one exemplary embodiment of the invention, the pad pitch PAD_PIT2 becomes relatively large as shown in FIG. 5. Thus, peripheral circuits necessary for operation of the semiconductor device, e.g., a buffer, an MOS transistor, a capacitor and a delay element etc., can be further formed in the regions where the bonding-type pads are not formed. Accordingly, areas occupied by a pad region and a peripheral circuit region of the device can be reduced, providing a more highly integrated semiconductor device.

Figure 6:
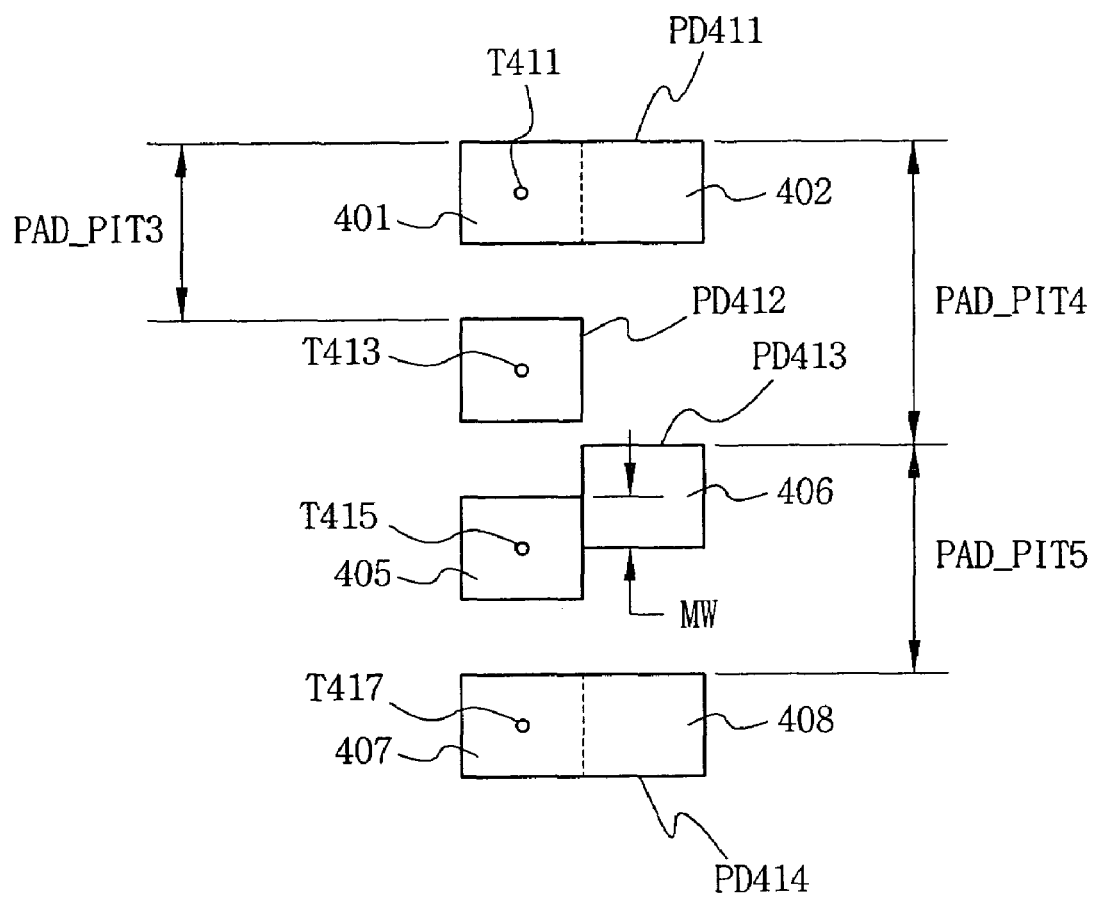
FIG. 6 is a schematic view illustrating a pad layout structure in a semiconductor device according to another exemplary embodiment of the invention.

FIG. 6 is a schematic view illustrating a pad layout structure in a semiconductor device according to another exemplary embodiment of the invention.

Referring to FIG. 6, there are shown pads PD411, PD412, PD413 and PD414, and pad pitches PAD_PIT3, PAD_PIT4 and PAD_PIT5.

In a semiconductor device according to another exemplary embodiment of the invention, a pad layout structure has first wire bonding pads PD411, PD413, and PD414 and a second non-wire bonding pads PD412.

The first pads PD411, PD413 and PD414 are classified into line type pads PD411, PD414 and a step type pad PD413. The first pads PD411, PD413, PD414 have a test region 401, 405, 407 and a wire bonding region 402, 406, 408. In the test region 401, 405, 407 a probe mark T411, T415, T417 is present at the point of contact with a probe tip of a probe card following testing of the semiconductor device.

The line type pads PD411, PD414 are pads wherein the widths of the test regions and the wire bonding regions substantially coincide with each other and are aligned and, as such, they are rectangular in shape.

In the step type pad PD413, a width of the wire bonding region 406 substantially coincides with a width of the test region 405, and a width MW of the connection portion between the wire bonding region 406 and the test region 405 is narrower than a width of the wire bonding region 406. That is, a sectional face of the step type pad PD413 is in an offset, or stepped, shape. In the step type pad PD413, the width MW of the connection portion of the wire bonding region 406 and the test region 405 is required to satisfy only a width of not less than a smallest width allowable by a design rule.

The first pad as wire bonding pads may be any one from the line-type pad and the step type pad. The pad pitch PAD_PIT3, PAD_PIT4, PAD_PIT5 is an interval between pads. In particular, a pad pitch PAD_PIT4 becomes wider than a pad pitch PAD_PIT3 that can be regarded as a conventional pad pitch. Especially, with the presence of a step-type pad PAD413, the pad pitch PAD_PIT5 between the wire bonding region 406 of the step-type pad PD413 and the wire bonding region 408 of the line-type pad PD414 becomes wider. In the regions of the pad regions of the device where bonding pad regions are not formed, peripheral circuits necessary for operation of the semiconductor device, e.g., a buffer, a MOS transistor, a capacitor and a delay element etc., can be formed. Accordingly, the area occupied by the pad region and the peripheral circuit region is reduced, thereby providing capacity for higher integration.

Referring to FIGS. 5 and 6, a layout method of pads formed in the semiconductor device, to be used for testing or wire bonding, will be described as follows.

Figure 4A:
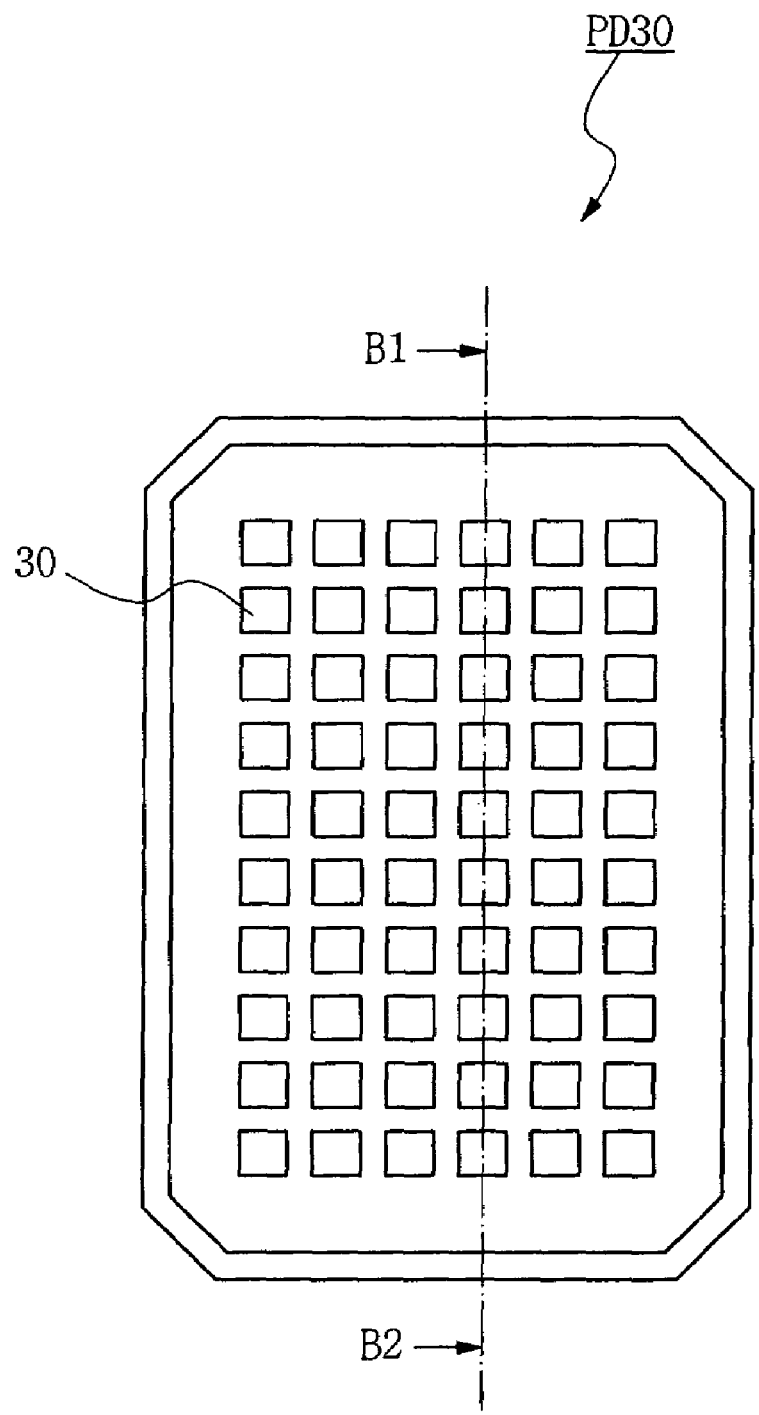
FIG. 4A is a plan view of a conventional mesh structural pad.
Figure 4B:
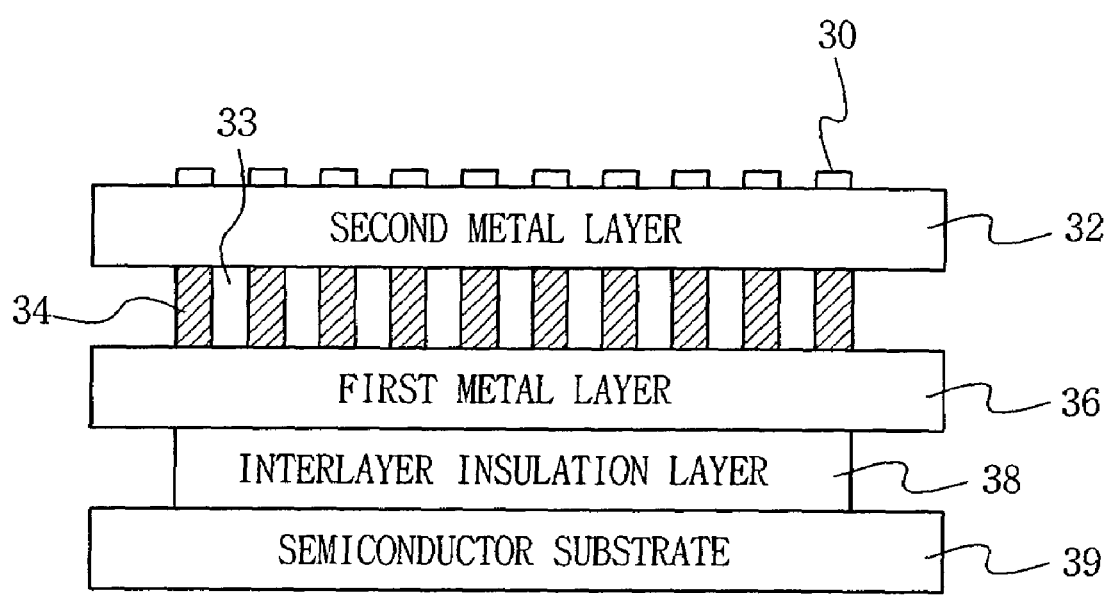
FIG. 4B is a sectional view taken along section line B1-B2 of FIG. 4A.

The pad layout method in a semiconductor device according to an exemplary embodiment of the invention includes disposing first pads PD411, PD413, PD414 shown in FIG. 4, and disposing second pads PD412 between some of the first pads.

The first pads PD411, PD413, PD414 are used for both testing of the semiconductor device and wire bonding, and can be disposed in a common row or column of the device.

The second pads PD412 are used only for testing and are not used for wire bonding, and therefore the size of the second pads is smaller than the first pads.

The first pads PD411, PD413 and PD414 each have a test region 401, 405, 407 that is used for testing, and a wire bonding region 402, 406, 408 that is used for wire bonding.

Each of the first pads may be any one from a line type pad PD411, PD414 and a step type pad PD413. Widths of the test region 401, 407 and the wire bonding region 402, 408 substantially coincide, and the regions are aligned, so the line type pad PD411, PD414 has a rectangular shape. In the step type pad PD413, a width of the wire bonding region 406 substantially coincides with a width of the test region 405, and the regions 406, 405 are offset so that a width MW of a portion connected between the wire bonding region 406 and the test region 405, or a region of connection, is narrower than a width of the wire bonding region 406.

Figure 7:
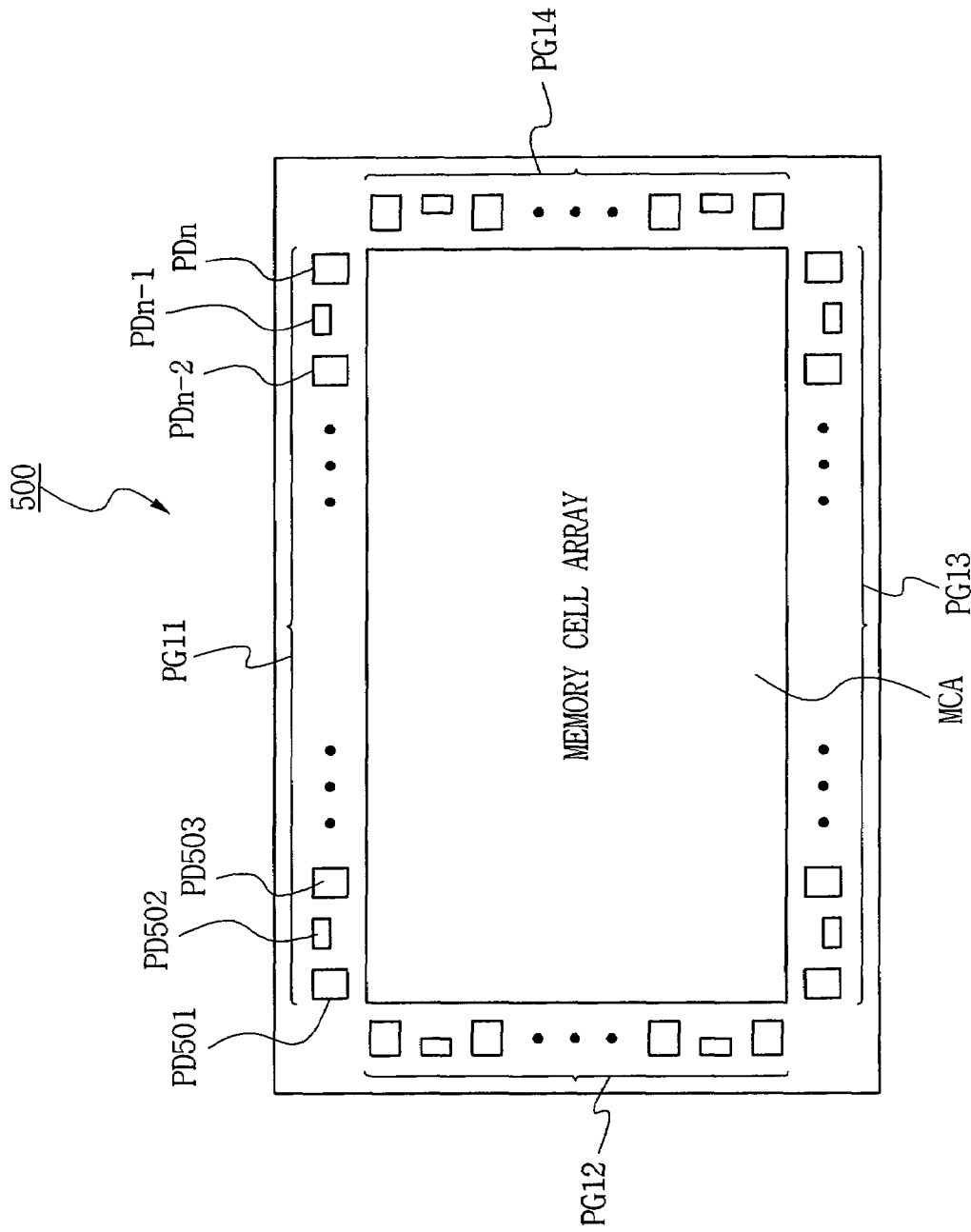
FIG. 7 is a schematic view illustrating a semiconductor device having a pad layout structure referred to in FIG. 5.

FIG. 7 is a schematic view illustrating a semiconductor device having a pad layout structure of the type referred to in FIG. 5, and illustrates an example of a semiconductor memory device in accordance with the present invention.

Referring to FIG. 7, in the semiconductor memory device 500, a memory cell array MCA and pad groups PG11, PG12, PG13 and PG14 are formed, the pad groups PG11, PG12, PG13 and PG14 being formed on a pad region in the peripheral region of the memory cell array MCA.

The memory cell array MCA can further include a plurality of sub memory cell arrays. A center pad region can be further provided between the sub memory cell arrays, and on the center pad region the pad groups can be further formed. The pad layout structure according to an exemplary embodiment of the invention is applicable not only to an edge pad system in which pads are formed only on an edge of memory cell array of the semiconductor memory device, but also to a central pad system in which pads are formed between a plurality of sub memory cell arrays.

For example, in one of the example pad groups PG11, the pad group PG 11 includes wire bonding pads PD501, PD503, . . . , PDn-2 and PDn, that is, pads that can be used for both wire bonding and testing, and non-wire bonding pads PD502 and PDn-1, that is, pads that are used only for testing. As described above in the example embodiments of FIGS. 5 and 6, the first pad as the wire bonding pad can be used for both testing and wire bonding, and the second pad as the non-wire bonding pad is not used for wire bonding but is used only for testing of the semiconductor memory device.

A semiconductor memory device has such a pad layout structure, thus peripheral circuits, e.g., a buffer, a MOS transistor, a capacitor, a delay element etc., necessary for operation of the semiconductor memory device can be further formed in regions of the pad region where the pads are not formed. For example, since the regions occupied by the pads is reduced, for example in the space formerly occupied by the bonding regions of the former non-wire bonding pads, there is additional space available for forming peripheral circuits in this region. Accordingly, the area of the device occupied by the pads is reduced, thereby offering an additional opportunity for higher integration degree in the semiconductor device.

Figure 8A:
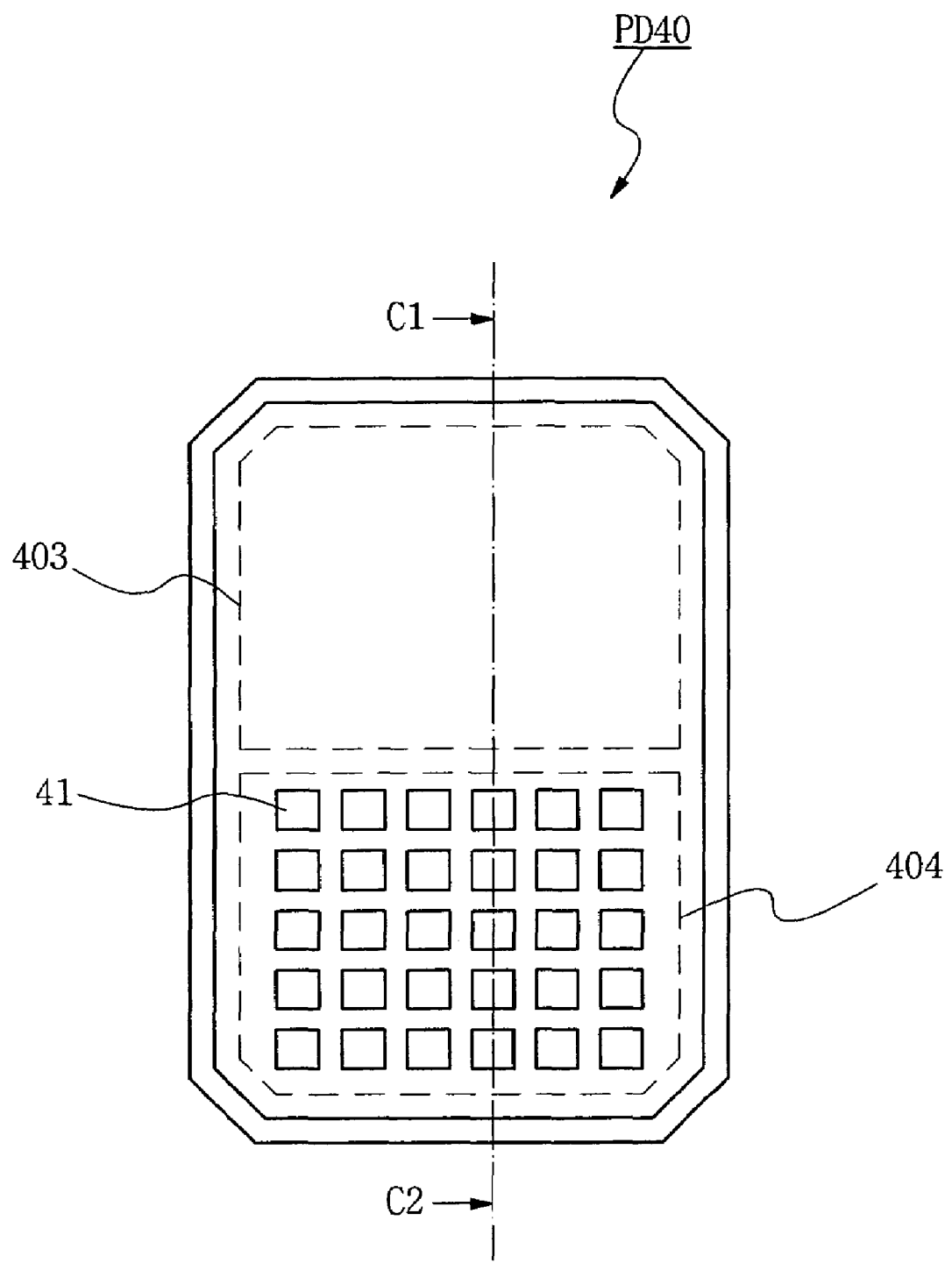
FIG. 8A is a plan view of pad structure according to one exemplary embodiment of the invention.
Figure 8B:
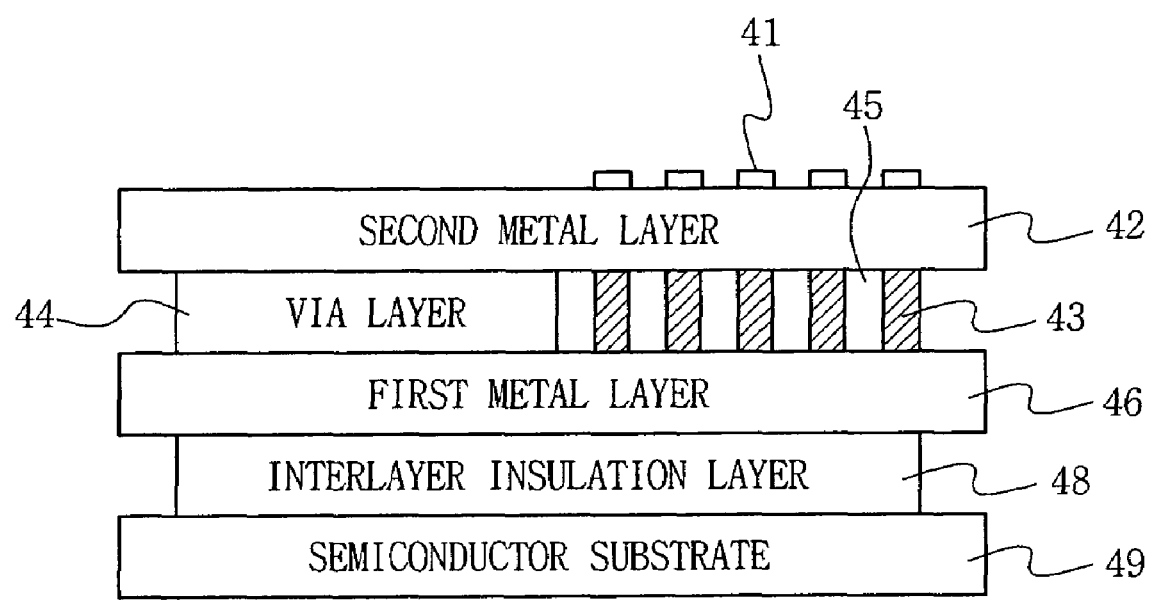
FIG. 8B is a sectional view taken along section line C1-C2 shown in FIG. 8A.

FIGS. 8A and 8B illustrate a pad structure according to an exemplary embodiment of the invention. FIG. 8A is a plan view of pad structure according to one exemplary embodiment of the invention. FIG. 8B is a sectional view taken along section line C1-C2 shown in FIG. 8A.

With reference to FIGS. 8A and 8B, a first interlayer insulation layer 48 is formed on a semiconductor substrate 49, and a first metal layer 46 is formed on the first interlayer insulation layer 48. A via layer 44 and contact plugs 43, for a connection between the first metal layer 46 and a second metal layer 42, are formed on the first metal layer 46, piercing through a second interlayer insulation layer 45.

The second metal layer 42 is divided into a probe tip contact region 403 and a wire bonding region 404. The probe tip contact region 403 has as smooth upper surface that is not embossed, and the wire bonding region 404 has an embossed upper surface. Reference number 41 indicates the embossed surface.

In a structure of a pad formed in the semiconductor device and used for a wire bonding, according to an exemplary embodiment, the probe tip contact region 403 is formed differently from the wire bonding region 404 in their formation characteristics, within a determined pad size, thereby reducing wear of the probe tip during testing procedures. The wire bonding region 404 has an embossed surface of mesh structure, thus improving a bonding force in wire bonding processes. To improve the bonding force in the wire bonding, the surface roughness of the wire bonding region 404 is beneficially higher than the surface roughness of the probe tip contact region 403.

The probe tip contact region 403 is a region at which a probe tip of probe card comes in contact during the testing of a semiconductor device through use of probe equipment having the pad PD40. When a probe tip is in contact with the probe tip contact region 403 of the pad PD40, then operation related signals such as a command input, data read and data write etc. signals, are input to the semiconductor device, or are output from the semiconductor device. Testing of the semiconductor device is thereby performed.

Describing in additional detail the structure of the pad PD40, the wire bonding region 404 has an embossed surface for a portion of the surface of the second metal layer 42 provided as an upper metal layer within a determined pad size. On a portion of the surface of the second metal layer 42 provided as the upper metal layer within the determined pad size, a probe tip contact region 403 does not have the embossed surface to reduce wear of probe tip at the location where the probe tip comes in contact with the pad during testing procedures.

In a lower portion of the wire bonding region 404, a plurality of contact plugs 43 are formed to connect a first metal layer 46 as a lower metal layer to a second metal layer 42 as an upper metal layer. An upper part of the second metal layer 42 connected with the contact plugs 43 has an embossed surface to strengthen the bonding force for wire bonding.

In a lower part of the probe tip contact region 403, a second interlayer insulation layer 45 is formed to electrically isolate the lower metal layer from the upper metal layer without forming contact plugs for a connection between the first metal layer 46 and the second metal layer 42. A via layer 44 can be formed to electrically connect the first metal layer 46 to the second metal layer 42, through the second interlayer insulation layer 45.

In the pad PD40 of a mesh structure, the wire bonding process can comprise a single bonding process in that one wire bonding is performed at a wire bonding pad on the wire bonding region 404. However, as certain types of products, such as a single in-line package (SIP) or multi chip package (MCP) become more popular, there is an increased need for double bonding, wherein a bonding of two wires is performed for one bonding pad. In such double bonding, the wire bonding region 404 may be a region where a first wire bonding is performed in a package process, and the probe tip contact region 403 may be a region where a second wire bonding different from the first wire bonding is performed in the package process of the double bonding. On this probe tip contact region 403, a probing through use of a probing device, that is, a test through a contact of probe tip, is executed, and then the second wire bonding is performed.

As described above, a pad structure is divided into two regions, a probe tip contact region 403 and a wire bonding region 404, thereby reducing wear of a probe tip used in the testing process.

Figure 9:
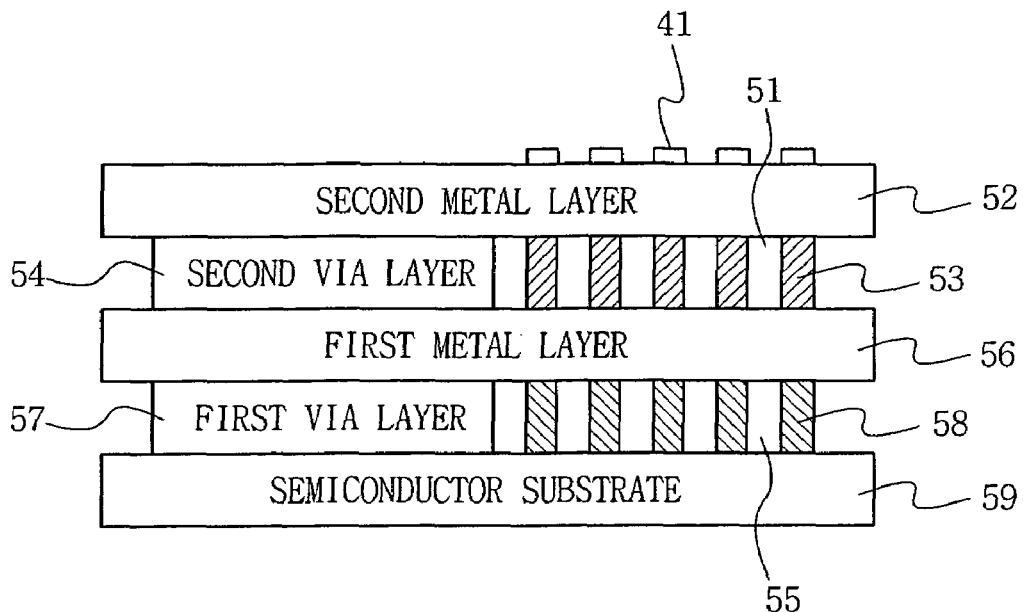
FIG. 9 is a sectional view of pad structure according to another exemplary embodiment of the invention.

FIG. 9 is a sectional view of pad structure according to another exemplary embodiment of the invention. With reference to FIG. 9, the pad has a structure in that a first via layer 57 and contact plugs 58 are formed on a semiconductor substrate 59, through a first interlayer insulation layer 55, and a first metal layer 56 and a semiconductor substrate 59 are connected with each other.

A second via layer 54 and contact plugs 53 are formed on the first metal layer 56, through a second interlayer insulation layer 51, and a second metal layer 52 and the first metal layer 56 are connected through use of the second via layer 54 and the contact plugs 53.

In the second metal layer 52, a probe tip contact region 403 (of FIG. 8A) not having an embossed surface is formed on a portion corresponding to a vertical upper part of the second via layer 54, and a wire bonding region 404 (of FIG. 8A) having an embossed surface is formed on a portion corresponding to a vertical upper part of the contact plugs 53. In probing, a probe tip is in contact with the probe tip contact region 403 (of FIG. 8A) not having the embossed surface, thus wear of the probe tip can be reduced, and simultaneously a bonding force is strengthened in a wire bonding process through use of the contact plugs 53 and 58, reducing open effects generated in the wire bonding process.

Figure 10:
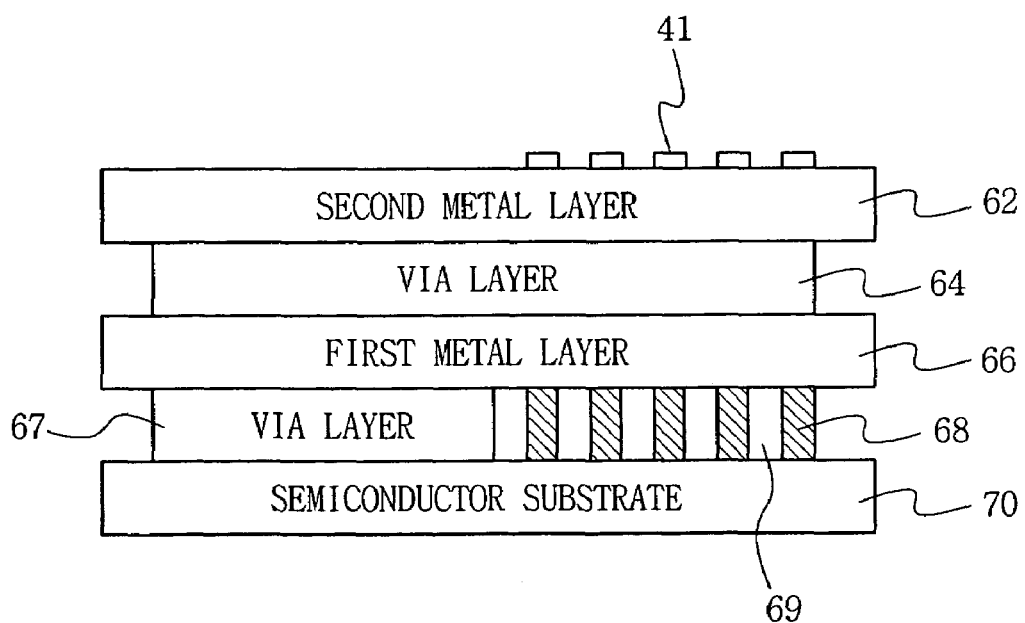
FIG. 10 is a sectional view of pad structure according to still another exemplary embodiment of the invention.

FIG. 10 is a sectional view of pad structure according to still another exemplary embodiment of the invention. With reference to FIG. 10, in the pad, a via layer 67 and contact plugs 68 are formed on a semiconductor substrate 70, through a first interlayer insulation layer 69, and a first metal layer 66 and the semiconductor substrate 70 are connected with each other through the via layer 67 and the contact plugs 68.

A via layer 64 is formed on the first metal layer 66, and a second metal layer 62 and the first metal layer 66 are connected through the via layer 64.

A probe contact region 403 (of FIG. 8A) and a wire bonding region 404 (of FIG. 8A) are formed on a second metal layer. In the second metal layer 62, a portion corresponding to an upper part of the via layer 67 becomes the probe contact region 403 (of FIG. 8A), and a portion corresponding to an upper part of the contact plugs 68 becomes a wire bonding region 404 (of FIG. 8A). That is, the wire bonding region 404 (of FIG. 8A) has an embossed surface to strengthen a bonding force in a wire bonding and reduce an open effect. The probe contact region 403 (of FIG. 8A) does not have the embossed surface, thereby reducing wear of probe tip in the probing.

Figure 1:
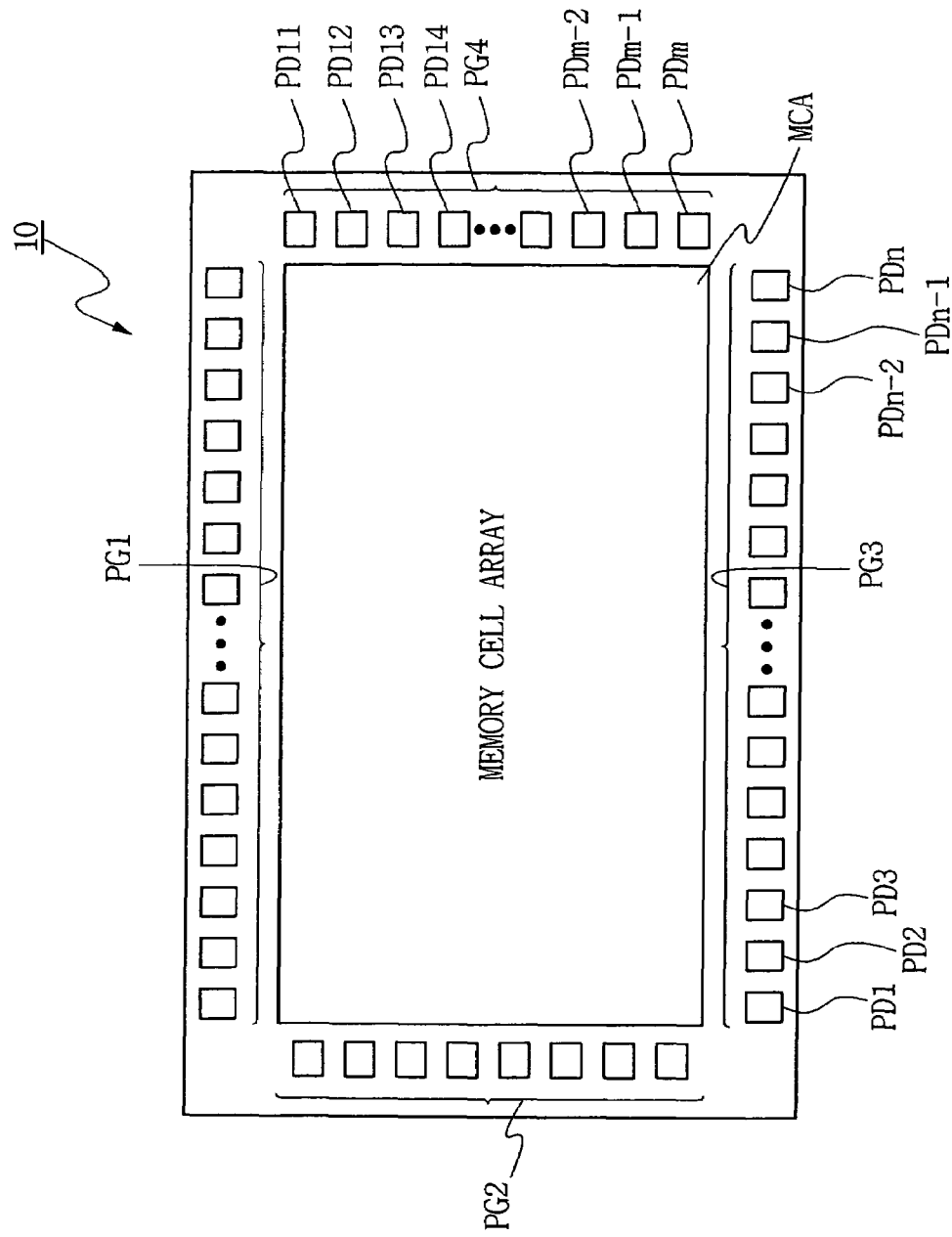
FIG. 1 is a schematic view illustrating a semiconductor memory device having conventional pads.
Figure 2:
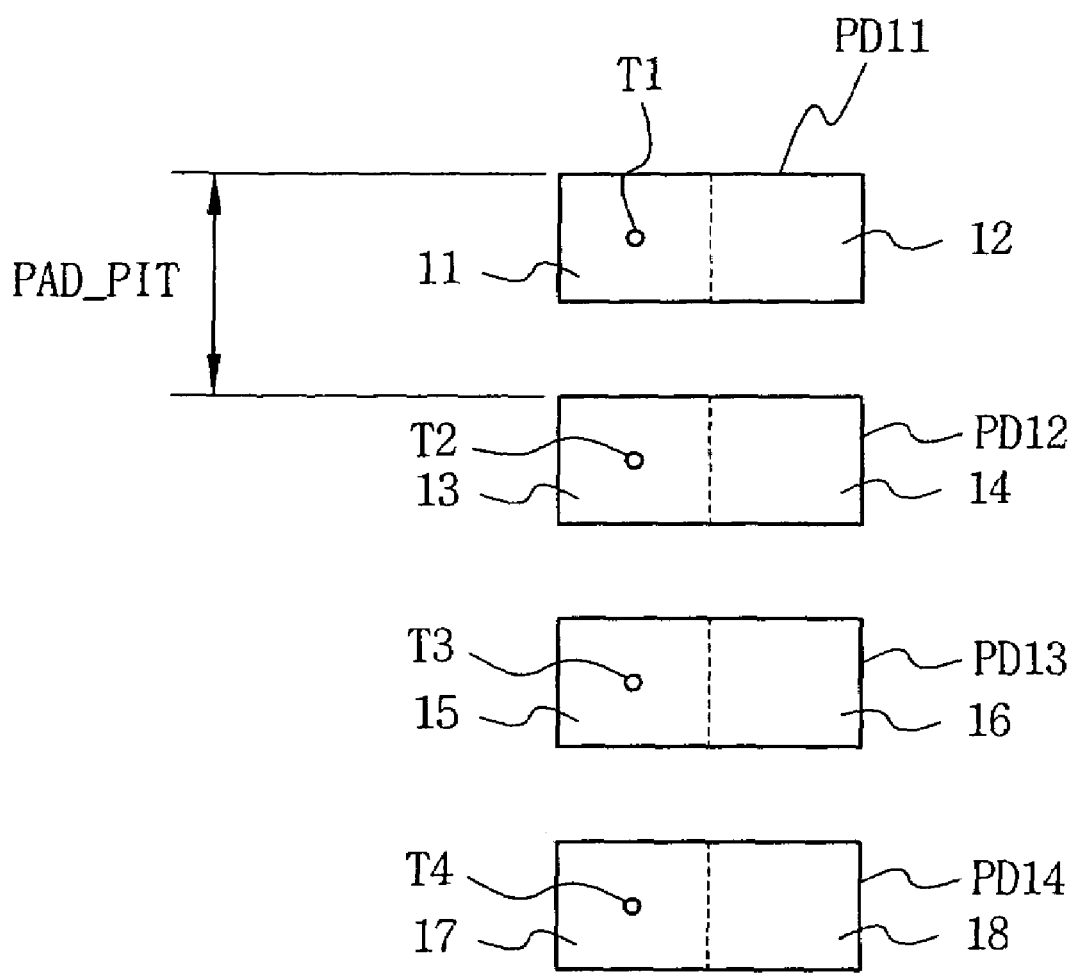
FIG. 2 is a schematic view illustrating an enlargement of the pads shown in FIG. 1.
Figure 3A:
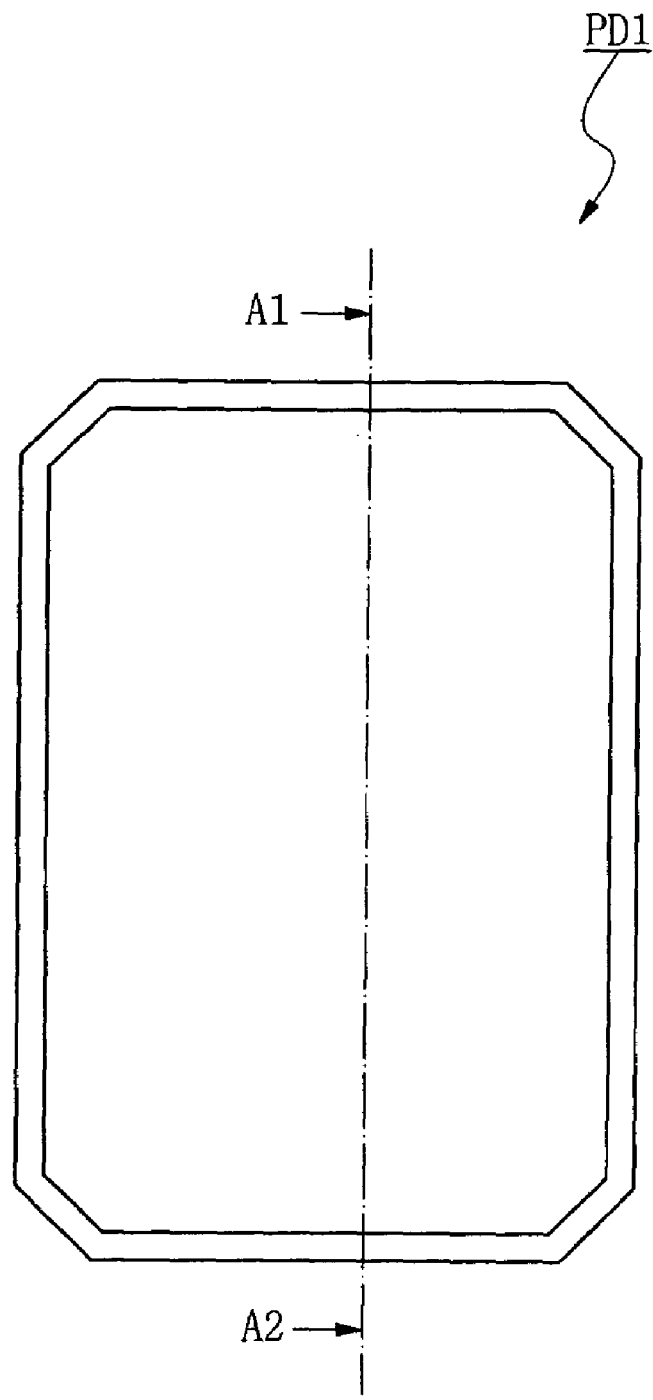
FIG. 3A is a plan view illustrating a conventional non-mesh structure of one of the pads shown in FIG. 1.
Figure 3B:
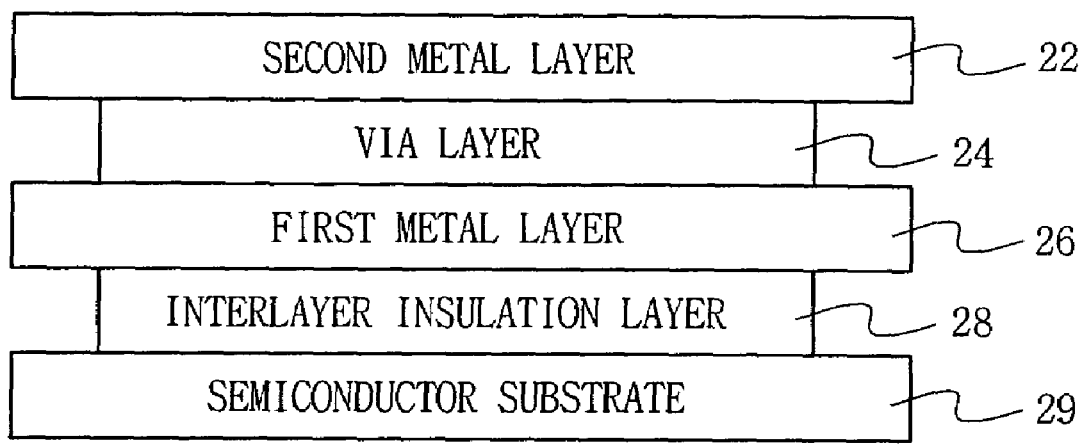
FIG. 3B is a sectional view taken along section line A1-A2 of FIG. 3A.

According to still another exemplary embodiment of the invention, in a semiconductor device having at least one or more wire bonding pads for electrical connection with external devices, a first pad and a second pad can be formed to have mutually different structures. Among the one or more pads, the first pad is configured to be in contact with a probe tip in a test of the semiconductor device, and the second pad is not configured to be in contact with a probe tip in the testing of the semiconductor device but instead is configured for wire bonding. In this embodiment, the first pad is a pad configured to be in contact with a probe tip during testing of a semiconductor device. The first pad may be a pad having two types of regions, as shown in FIG. 8A, and may be a pad of non-mesh structure as shown in FIGS. 3A and 3B. When a probe tip is in contact with the pad, the probe tip is in contact with a portion not having an embossed surface, thereby reducing wear of the probe tip. In addition, in this embodiment, the second pad is not configured to contact a probe tip during testing of the semiconductor device, thus there is no need to consider wear of the probe tip. Accordingly, forming an embossed surface on the second pad is beneficial to strengthen the bonding force of the wire bonding process.

Such pad structure according to the exemplary embodiments of the invention described above can be applied to a semiconductor memory device, and can be diversely applied to semiconductor devices such as a CPU (Central Processing Unit), a microprocessor, a CCD (Charge Coupled Device), and a LCD (Liquid Crystal Display) drive device etc. in which pads are formed.

As described above, according to exemplary embodiments of the invention, in a pad layout structure and pad structure of an advanced semiconductor memory device, pad pitch can be increased within a limited region. Accordingly, additional area is made available for the formation of peripheral circuits in regions that otherwise would be occupied by conventional pad formation, thereby realizing higher integration of semiconductor memory devices.

In addition, in a pad layout structure of semiconductor memory device, the size of a pad that is used for testing but is not used for wire bonding, and a size of pad used for both testing and wire bonding, are different, thereby reducing the area occupied by the pad region of the device.

According to the exemplary embodiments of the invention, a pad layout structure of semiconductor memory device having pads formed in various types and used for a test and wire bonding is provided. A pad region where pads are formed is reduced in an area, thus realizing high integration of semiconductor memory devices.

A pad structure in an enhanced semiconductor device is provided. Wear of probe tips used in probing during testing can be reduced, thereby reducing additional expense generated by the frequent exchange of probing devices caused by probe tip wear. In addition, excessive generation of particles caused by contact between a probe tip and a pad can be reduced. In addition, process time required for probe tip cleaning to remove particles generated during such contact of probe tip is reduced. In addition the bonding force with the pad in a wire bonding process can be more strengthened, improving package yield.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A layout structure of pads formed on a semiconductor device and used for at least one of testing and wire bonding of the semiconductor device, a first subset of the pads being non-wire-bonding pads that are used for testing of the device and not for wire bonding of the device, a second subset of the pads being wire-bonding pads that are used for wire bonding of the device, wherein the non-wire-bonding pads each has a first surface area that is less than a second surface area of each of the wire-bonding pads, wherein at least one of the wire-bonding pads is of a step type, wherein at least one of the step type wire-bonding pads includes a test region used during testing of the semiconductor device and a wire bonding region used during wire bonding of the semiconductor device, wherein the non-wire-bonding pads and the test region of the at least one of the step type wire-bonding pads are positioned on an axis, wherein the wire bonding region has a width in the direction of the axis that is the same as a width of the test region on the axis, and wherein the wire bonding region is offset relative to the test region such that the wire bonding region of the at least one of the step type wire-bonding pads is closer to an adjacent non-wire-bonding pad on the axis than the test region of the at least one of the step type wire-bonding pads on the axis.

2. The layout structure of claim 1, wherein both at least one of the wire-bonding pads and at least one of the non-wire-bonding pads are disposed in a same row or column of pads of the device.

3. The layout structure of claim 1, wherein at least one of the non-wire-bonding pads is constructed and arranged to be in contact with, and electrically connected to, a probe tip of probe card during testing of the semiconductor device.

4. The structure of claim 1, wherein the test region is constructed and arranged to be in contact with, and electrically connected to, a probe tip of probe card during testing of the semiconductor device.

5. The structure of claim 4, wherein the wire bonding region is a region where a wire for external electrical connection is to be bonded to the semiconductor device.

6. A structure of a pad of a semiconductor device used for wire bonding of the device, the pad having a partially-embossed contiguous top metal layer that is divided into a first portion having a wire bonding region and a second portion having a probe tip contact region, wherein the first portion of the partially-embossed contiguous layer having the wire bonding region has an embossed upper surface and wherein the second portion of the partially-embossed contiguous layer having the probe tip contact region has an upper surface that is not embossed.

7. The structure of claim 6 further comprising a plurality of contact plugs connecting the top metal layer to a bottom metal layer through an insulating layer in the wire bonding region of the pad.

8. The structure of claim 7, wherein the contact plugs are not formed in the probe tip contact region of the device.

9. The structure of claim 7, wherein the insulating layer is further formed between the top metal layer and the bottom metal layer in the probe tip contact region of the pad.

10. The structure of claim 9, further comprising a via layer in the insulating layer of the probe tip contact region to electrically connect the bottom metal layer to the top metal layer in the probe tip contact region.

11. The structure of claim 6, wherein the wire bonding region is a region where a wire for external electrical connection is to be bonded to the semiconductor device in a first wire bonding process.

12. The structure of claim 11, wherein the probe tip contact region is a region where a wire for external electrical connection is to be bonded to the semiconductor device in a second wire bonding process that is different than the first wire bonding process.

13. The structure of claim 12, wherein the probe tip contact region is a region where the second wire bonding process is performed following probing by contact of a probe tip.

14. The structure of claim 6 further comprising a via layer connecting a bottom metal layer to the top metal layer, and a plurality of contact plugs connecting the bottom metal layer to a substrate of the device through an insulating layer in the wire bonding region of the pad.

15. A semiconductor device having wire bonding pads that are configured to obtain an external electrical connection, wherein a first pad and a second pad among the wire bonding pads have different structures, the first pad being a non-wire-bonding pad that is used for testing of the device and not for wire bonding of the device and being constructed and arranged for being in contact with a probe tip during testing of the device, the second pad being a wire-bonding pad that is used for wire bonding of the device and not for testing of the device and being constructed and arranged for wire bonding of the device during a wire bonding process, wherein the second pad has an embossed surface to improve a bonding force in the wire bonding process, and wherein the first pad does not have the embossed surface, wherein the first pad comprises a partially-embossed top metal layer that is divided into a first portion having a wire bonding region and a second portion having a probe tip contact region, wherein the first portion of the partially-embossed contiguous layer having the wire bonding region has an embossed upper surface and wherein the second portion of the partially-embossed contiguous layer having the probe tip contact region has an upper surface that is not embossed.

16. A layout method of pads formed on a semiconductor device and used for at least one of testing and wire bonding of the semiconductor device, comprising
disposing a first subset of the pads to be non-wire-bonding pads that are used for testing of the device and not for wire bonding of the device; and
disposing a second subset of the pads to be wire-bonding pads that are used for wire bonding of the device, wherein the non-wire-bonding pads each has a first surface area that is less than a second surface area of each of the wire-bonding pads, and wherein at least one of the wire-bonding pads is of a step type, wherein at least one of the step type wire-bonding pads includes a test region used during testing of the semiconductor device and a wire bonding region used during wire bonding of the semiconductor device, wherein the non-wire-bonding pads and the test region of the at least one of the step type wire-bonding pads are positioned on an axis, wherein the wire bonding region has a width in the direction of the axis that is the same as a width of the test region on the axis, and wherein the wire bonding region is offset relative to the test region such that the wire bonding region of the at least one of the step type wire-bonding pads is closer to an adjacent non-wire-bonding pad on the axis than the test region of the at least one of the step type wire-bonding pads on the axis.

17. The layout structure of claim 1, wherein a width of a connection portion between the wire bonding region and the test region of the at least one of the step type wire-bonding pads is narrower than a width of the wire bonding region.

18. The layout structure of claim 16, wherein a width of a connection portion between the wire bonding region and the test region of the at least one of the step type wire-bonding pads is narrower than a width of the wire bonding region.

* * * * *